(12) United States Patent
Yoshida

(10) Patent No.: US 10,624,225 B1
(45) Date of Patent: Apr. 14, 2020

(54) ELECTRONIC CIRCUIT HOLDER

(71) Applicant: AIDENKI CO., LTD., Sayama-shi, Saitama (JP)

(72) Inventor: Tetsuya Yoshida, Sayama (JP)

(73) Assignee: AIDENKI CO., LTD., Sayama-shi (JP)

( * ) Notice: Subject to any disclaimer, the term of this patent is extended or adjusted under 35 U.S.C. 154(b) by 0 days.

(21) Appl. No.: 16/576,922

(22) Filed: Sep. 20, 2019

(30) Foreign Application Priority Data

Sep. 21, 2018 (JP) .................... 2018-178146

(51) Int. Cl.
*H05K 7/08* (2006.01)
*H05K 7/02* (2006.01)

(52) U.S. Cl.
CPC .............. *H05K 7/08* (2013.01); *H05K 7/023* (2013.01)

(58) Field of Classification Search
CPC ........ H05K 7/08; H05K 7/023; H05K 7/1092; H01L 25/10
See application file for complete search history.

(56) References Cited

U.S. PATENT DOCUMENTS

| | | | | |
|---|---|---|---|---|
| 2,279,864 A | * | 4/1942 | Eide | A47B 47/042 211/189 |
| 3,066,436 A | * | 12/1962 | Schuh | A63H 33/06 446/115 |
| 3,290,559 A | * | 12/1966 | Kirby | H05K 7/20509 361/733 |
| 3,715,629 A | * | 2/1973 | Swengel, Sr. | H05K 7/023 361/733 |
| 4,082,356 A | * | 4/1978 | Johnson | A47C 4/021 273/160 |
| 4,140,065 A | * | 2/1979 | Chacon | A47C 4/021 108/156 |
| 4,502,098 A | * | 2/1985 | Brown | H05K 1/144 361/690 |
| 4,688,864 A | * | 8/1987 | Sorel | H05K 7/023 361/730 |
| 4,704,313 A | * | 11/1987 | Maier | H02B 15/04 428/33 |

(Continued)

FOREIGN PATENT DOCUMENTS

| JP | S60076084 U | 5/1985 |
|---|---|---|
| JP | S60118285 U | 8/1985 |

(Continued)

*Primary Examiner* — Stanton L Krycinski
(74) *Attorney, Agent, or Firm* — Muncy, Geissler, Olds & Lowe, P.C.

(57) ABSTRACT

An electronic circuit holder includes a fixing plate, a pair of side wall plates between which the fixing plate is interposed, and a seat having seat-side lock penetrating holes arranged at a predetermined interval. The fixing plate has a fixing portion for fixing an electronic circuit on the fixing plate, and lock protrusions on opposed sides of the fixing plate. Each side wall plate has lock penetrating holes. The lock protrusions of the fixing plate are engaged with the lock penetrating holes to hold the fixing plate at a predetermined height. A first of the pair of side wall plates has, on a side thereof, a first wall-side lock protrusion, and a second of the pair of side wall plates has, on a side thereof, a second wall-side lock protrusion. The first and second wall-side lock protrusions are engaged with two of the seat-side lock penetrating holes.

4 Claims, 11 Drawing Sheets

(56) References Cited

U.S. PATENT DOCUMENTS

| | | | | |
|---|---|---|---|---|
| 4,868,712 A | * | 9/1989 | Woodman | H01L 23/5385 |
| | | | | 361/689 |
| 4,872,843 A | * | 10/1989 | Anstey | H05K 7/023 |
| | | | | 439/69 |
| 4,991,927 A | * | 2/1991 | Anstey | H05K 7/023 |
| | | | | 385/53 |
| 5,016,138 A | * | 5/1991 | Woodman | H01L 23/5385 |
| | | | | 174/252 |
| 5,117,282 A | * | 5/1992 | Salatino | H05K 1/189 |
| | | | | 257/686 |
| 5,124,886 A | * | 6/1992 | Golobay | G11B 33/02 |
| | | | | 361/679.32 |
| 5,343,075 A | * | 8/1994 | Nishino | H01L 23/3107 |
| | | | | 257/686 |
| 5,377,077 A | * | 12/1994 | Burns | H01L 21/565 |
| | | | | 165/185 |
| 5,420,751 A | * | 5/1995 | Burns | H01L 21/565 |
| | | | | 165/185 |
| 5,514,907 A | * | 5/1996 | Moshayedi | H01L 25/10 |
| | | | | 257/685 |
| 5,707,242 A | * | 1/1998 | Mitra | H05K 7/023 |
| | | | | 439/74 |
| 6,619,749 B2 | * | 9/2003 | Willy | A47B 3/06 |
| | | | | 297/440.13 |
| 9,909,604 B1 | * | 3/2018 | Fawcett | F16B 12/125 |
| 10,041,521 B2 | * | 8/2018 | Shin | F16B 17/00 |
| 10,499,524 B2 | * | 12/2019 | Wurmfeld | H05K 7/1487 |
| 2018/0326319 A1 | * | 11/2018 | Purwar | A63H 33/101 |

FOREIGN PATENT DOCUMENTS

| | | |
|---|---|---|
| JP | 2005260018 A | 9/2005 |
| JP | 2007173505 A | 7/2007 |
| JP | 2014212152 A | 11/2014 |

\* cited by examiner

ELECTRONIC CIRCUIT HOLDER

CROSS REFERENCE TO RELATED APPLICATIONS

This application claims the benefit of foreign priority to Japanese Patent Application No. 2018-178146, filed on Sep. 21, 2018, which is incorporated by reference in its entirety.

BACKGROUND OF THE INVENTION

Field of the Invention

The disclosure relates to an electronic circuit holder.

Description of the Related Art

Conventionally, in order to learn electronic circuits, commercially available electronic circuits or breadboards have been used (for example, see Japanese Patent Laid-Open No. 2014-212152). For example, a plurality of lines connected to each terminal of an electronic circuit are inserted into socket holes arranged in a matrix on a breadboard, and a plurality of electronic circuits are connected via the breadboard. As a result, an electronic device can be experimentally produced.

However, when the lines extending from the electronic circuit are connected to the breadboard, the electronic circuit may be moved by pulling the lines, which makes a wiring operation difficult. Also, in a case where a first electronic circuit has already been connected to the breadboard, the lines of the first electronic circuit may be pulled out of the socket holes if the breadboard is moved when a second electronic circuit is further connected, which makes the wiring operation difficult.

Further, when a plurality of electronic circuits are connected via the breadboard, wiring routing becomes complicated unless each electronic circuit is arranged at an appropriate position to the breadboard, for example.

The present invention has been made in view of the foregoing, and an object of the present invention is to provide an electronic circuit holder which can execute simple wiring operation and can eliminate complication of the wiring routing from an electronic circuit.

SUMMARY OF THE INVENTION

In some embodiments, an electronic circuit holder includes: a fixing plate, a pair of side wall plates between which the fixing plate is configured to be interposed, and a seat having a plurality of seat-side lock penetrating holes arranged at a predetermined interval. The fixing plate has a fixing portion for fixing an electronic circuit on a surface of the fixing plate, and lock protrusions on opposed sides of the fixing plate. A first of the pair of side wall plates has first lock penetrating holes, and a second of the pair of side wall plates has second lock penetrating holes. The lock protrusions of the fixing plate are engaged with the first and second lock penetrating holes to hold the fixing plate at a predetermined height. The first of the pair of side wall plates has, on a side thereof, a first wall-side lock protrusion, and the second of the pair of side wall plates has, on a side thereof, a second wall-side lock protrusion. The first and second wall-side lock protrusions are defined as a pair of wall-side lock protrusions configured to be engaged with a pair of seat-side lock penetrating holes of the plurality of seat-side lock penetrating holes. The seat allows a user to select the pair of seat-side lock penetrating holes from among the plurality of seat-side lock penetrating holes to engage the pair of wall-side lock protrusions with the pair of seat-side lock penetrating holes, thereby changing a position of the fixing plate on the seat in accordance with a position of another part to be installed on the seat. The first lock penetrating holes of the first of the pair of side wall plates and the second lock penetrating holes of the second of the pair of side wall plates are arranged in two or more rows. The position of the fixing plate is changed in a height direction of the seat by switching to one of the two or more rows of the first and second lock penetrating holes with which the lock protrusions of the fixing plate are engaged, in accordance with the position of another part to be installed on the seat.

According to some embodiments of the present invention, the electronic circuit can be fixed to the seat together with other parts. Consequently, a wiring operation can be executed in a state that the electronic circuit is stabled, and thus the simple wiring operation can be executed. Also, the electronic circuit can be freely moved to a desired position on the seat and fixed to the seat in accordance with a wiring situation of the electronic circuit on the seat, which can eliminate complication of the wiring routing from the electronic circuit.

DETAILED DESCRIPTION OF THE PREFERRED EMBODIMENTS

Reference will be made below to embodiments of the present invention.

(1) Outline of Electronic Circuit Holder

Figure 1:
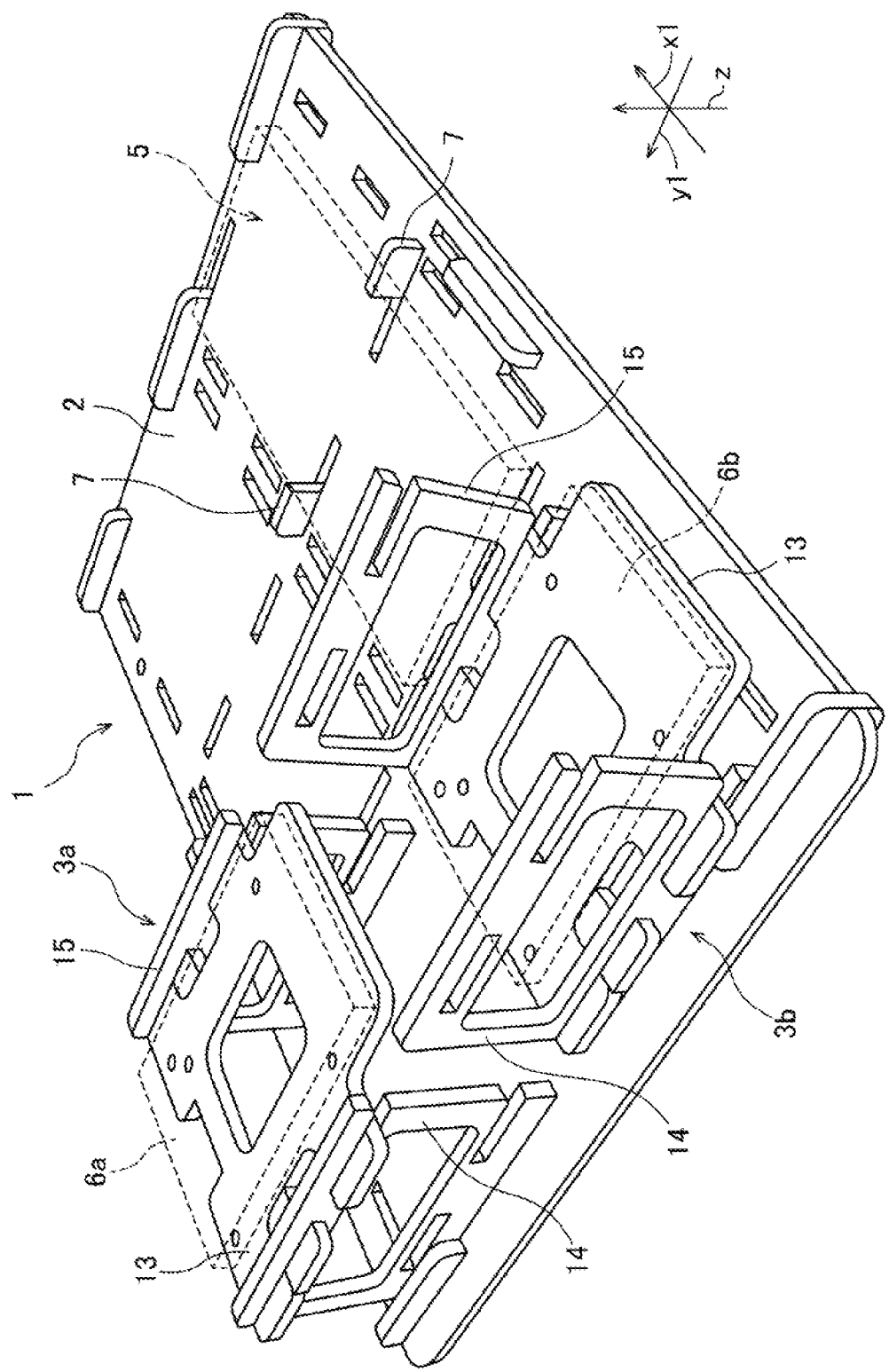
FIG. 1 is a schematic view illustrating one of usage examples of an electronic circuit holder.
Figure 2:
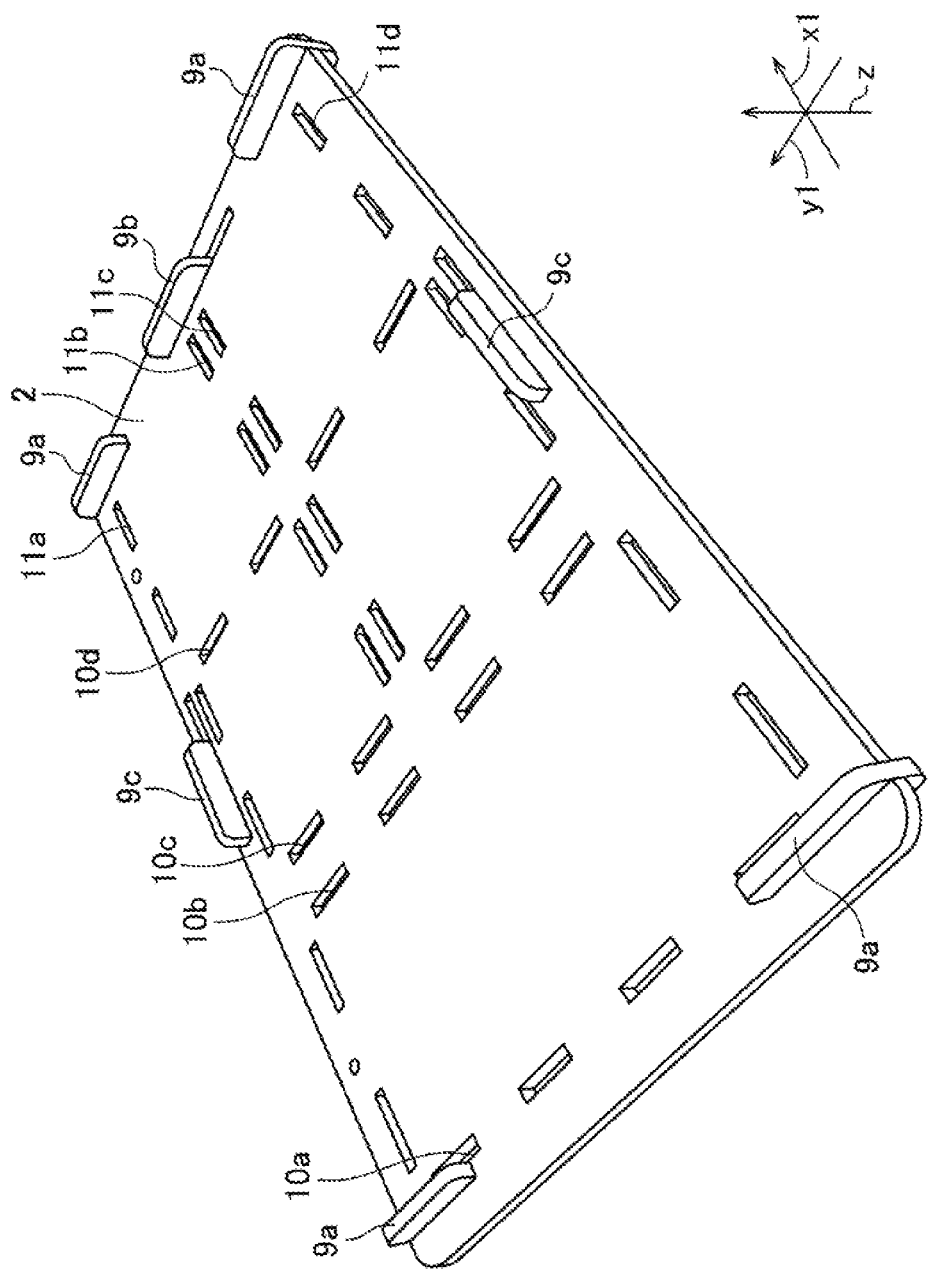
FIG. 2 is a schematic view illustrating a configuration of a seat.

FIG. 1 is a schematic view illustrating one of usage examples of an electronic circuit holder 1 according to the present invention. In the electronic circuit holder 1, all components are made of wood, for example, and a user can freely combine plate-shaped members which are components and install them on a seat 2.

The electronic circuit holder 1 has a configuration of freely changing a position of, for example, a breadboard 5 and commercially available electronic circuits 6a and 6b including a single-board computer called as a Raspberry Pi® on the seat 2 in accordance with a wiring situation, thereby fixing the breadboard 5 and the electronic circuits 6a and 6b at a desired position using the plate-shaped members.

The single-board computer, which is one example of the electronic circuits 6a and 6b, is a computer in which various circuits including a circuit board, an integrated circuit as a control unit, a memory, a connector and a wireless communication unit are mounted, for example.

In the electronic circuit holder 1, such a wiring operation is executed that one end of a line (not shown) is connected to a terminal of a predetermined circuit portion implemented to the electronic circuits 6a and 6b, a predetermined socket hole is selected among socket holes vertically and horizontally arranged in the breadboard 5, and the other end of the line is inserted into the predetermined socket hole, etc. In this way, in the electronic circuit holder 1, the electronic circuits 6a and 6b and the breadboard 5 are connected on the seat 2, and then a desired electronic device can be experimentally produced.

In a usage example of the electronic circuit holder 1 shown in FIG. 1, the breadboard 5 is directly fixed on the seat 2 by a fixing member 7, and the electronic circuits 6a and 6b are respectively held by electronic circuit holding units 3a and 3b to be fixed to the seat 2. In this usage example, the breadboard 5 is arranged such that a longitudinal direction is along a longitudinal direction x1 of the seat 2, and fixed to be close to one of four corners (in FIG. 1, a right corner) at which a long side and a short side of the seat 2 intersects.

To the first electronic circuit holding unit 3a, the electronic circuit 6a is fixed on a surface of a plate-shaped fixing plate 13, and the fixing plate 13 is interposed between a pair of side wall plates 14 and 15. In the electronic circuit holding unit 3a, the fixing plate 13 is provided at an upper row at a predetermined height from the seat 2 by the pair of side wall plates 14 and 15.

On the other hand, in the second electronic circuit holding unit 3b, although it has the same configuration as that of the first electronic circuit holding unit 3a, the fixing plate 13 on which the electronic circuit 6b is fixed is positioned at a lower row which is lower than the fixing plate 13 on the first electronic circuit holding unit 3a.

The electronic circuit holding units 3a and 3b are formed by combining the fixing plate 13 and the pair of side wall plates 14 and 15. Moreover, when an assembly operation is executed, the height of the electronic circuits 6a and 6b from the seat 2 can be adjusted by freely changing the position of the fixing plate 13 to the upper row or the lower row in accordance with a fixing position of another part such as the breadboard 5.

In the usage example of the electronic circuit holder 1 shown in FIG. 1, the fixing plate 13 is arranged at the upper row by the first electronic circuit holding unit 3a and the fixing plate 13 is arranged at the lower row by the second electronic circuit holding unit 3b. However, when the assembly operation is executed, both fixing plates 13 of the electronic circuit holding units 3a and 3b can be arranged at the upper row or the lower row.

In the usage example of the electronic circuit holder 1 shown in FIG. 1, the electronic circuit holding units 3a and 3b are serially arranged at a left region of the seat 2, and the breadboard 5 is arranged horizontally (in the longitudinal direction x1 of the seat 2) at a right region of the seat 2. However, the electronic circuit holding units 3a and 3b may be horizontally arranged at the right region of the seat 2, and the breadboard 5 may be arranged vertically (in a short direction y1 of the seat 2) at the left region of the seat 2. Hereinafter, such a configuration of the seat 2 and the electronic circuit holding units 3a and 3b will be sequentially explained.

(2) Configuration of Seat

The seat 2 according to this embodiment is made from a woody plate-shaped member having a predetermined thickness, and plate-shaped protrusions 9a are respectively provided at four corners of the rectangular shape of the seat 2. In each of the four plate-shaped protrusions 9a, a plane plate is vertically arranged to a surface of the seat 2, and a longitudinal direction of the plate-shaped protrusions 9a is along the short side of seat 2.

In the seat 2, an auxiliary plate-shaped protrusion 9b is provided near the center of one short side, and an auxiliary plate-shaped protrusion 9c is provided near the center of opposed long sides. A longitudinal direction of the plate-shaped protrusion 9b provided near the center of the short side of the seat 2 is the same as a longitudinal direction of two plate-shaped protrusions 9a provided at the corners, and three plate-shaped protrusions 9a, 9b and 9a are arranged at even intervals along the short side of the seat 2.

The plate-shaped protrusion 9c provided near the center of the long side of the seat 2 is arranged along the long side of the seat 2 such that its longitudinal direction is orthogonal to a longitudinal direction of the plate-shaped protrusions 9a provided at the four corners.

In addition to such configuration, in the seat 2, a plurality of long holes penetrating the thickness (hereinafter, they are referred to as seat-side lock penetrating holes) 10a, 10b, 10c, 10d, 11a, 11b, 11c and 11d are regularly provided. In the seat 2 according to the embodiment, a plurality of seat-side lock penetrating holes 10a arranged in a short direction y1 of the seat 2, a plurality of seat-side lock penetrating holes 10b arranged in the short direction y1 of the seat 2 in the same manner, a plurality of seat-side lock penetrating holes 10c arranged in the short direction y1 of the seat 2 in the same manner, and a plurality of seat-side lock penetrating holes 10d arranged in the short direction y1 of the seat 2 in the same manner are sequentially arranged along the longitudinal direction x1 of the seat 2.

In the seat 2 according to this embodiment, the seat-side lock penetrating holes 10a and 10b in the first and second rows separated by a predetermined distance constitute a pair in which the electronic circuit holding units 3a and 3b are arranged, and in the same manner, the seat-side lock penetrating holes 10c and 10d in the third and fourth rows constitute a pair in which the electronic circuit holding units 3a and 3b are arranged.

For example, the seat-side lock penetrating holes 10a and 10b in the first and second rows separated by the predetermined distance are provided at the left region of the seat 2, while the seat-side lock penetrating holes 10c and 10d in the third and fourth rows separated by the predetermined distance are provided at a substantially center region of the seat 2.

In this case, in the plurality of seat-side lock penetrating holes 10a in the first row, each long hole extends along the short direction y1 and arranged in a row with predetermined intervals along the short direction y1. Also, in the plurality of seat-side lock penetrating holes 10b in the second row, each hole extends along the short direction y1. Also, the plurality of seat-side lock penetrating holes 10b in the second row are arranged in a row with predetermined intervals along the short direction y1 at a position separated by the predetermined distance from the seat-side lock penetrating holes 10a in the first row running in parallel with the seat-side lock penetrating holes 10a in the first row.

The distance from the seat-side lock penetrating holes 10a in the first row to the seat-side lock penetrating holes 10b in the second row is equal to the interval between the pair of side wall plates 14 and 15 of the electronic circuit holding units 3a and 3b (FIG. 1).

Further, in the plurality of seat-side lock penetrating holes 10c in the third row, each long hole extends along the short direction y1. The plurality of seat-side lock penetrating holes 10c in the third row are arranged in a row with predetermined intervals along the short direction y1 at a position adjacent to the seat-side lock penetrating holes 10b in the second row running in parallel with the seat-side lock penetrating holes 10a and 10b in the first and second rows.

In the plurality of seat-side lock penetrating holes 10d in the fourth row, each long hole extends along the short direction y1. The plurality of seat-side lock penetrating holes 10d in the fourth row are arranged in a row with predetermined intervals along the short direction y1 at a position separated by the predetermined distance from the seat-side lock penetrating holes 10c in the third row running in parallel with the seat-side lock penetrating holes 10c in the third row.

The distance between the seat-side lock penetrating holes 10c in the third row and the seat-side lock penetrating holes 10d in the fourth row is equal to the interval between the pair of side wall plates 14 and 15 of the electronic circuit holding units 3a and 3b (FIG. 1).

The interval between the seat-side lock penetrating holes 10a in the first row is equal to the interval between wall-side lock protrusions 24a and 24b (24c and 24d) of the side wall plate 14 (15). In the same manner, the interval between the seat-side lock penetrating holes 10b in the second row, the interval between the seat-side lock penetrating holes 10c in the third row and the interval between the seat-side lock penetrating holes 10d in the fourth row are equal to the interval between the wall-side lock protrusions 24a and 24b (24c and 24d) of the side wall plate 14 (15).

In addition, in the seat 2 according to this embodiment, a plurality of seat-side lock penetrating holes 11a arranged in the longitudinal direction x1 of the seat 2, a plurality of seat-side lock penetrating holes 11b arranged in the longitudinal direction x1 of the seat 2 in the same manner, a plurality of seat-side lock penetrating holes 11c arranged in the longitudinal direction x1 of the seat 2 in the same manner and a plurality of seat-side lock penetrating holes 11d arranged in the longitudinal direction x1 of the seat 2 in the same manner are sequentially arranged along the short direction y1 of the seat 2.

In the seat 2 according to this embodiment, the seat-side lock penetrating holes 11a and 11b in the first and second columns separated by a predetermined distance constitute a pair in which the electronic circuit holding units 3a and 3b are arranged, and in the same manner, the seat-side lock penetrating holes 11c and 11d in the third and fourth columns separated by the predetermined distance constitute a pair in which the electronic circuit holding units 3a and 3b are arranged.

For example, the seat-side lock penetrating holes 11a and 11b in the first and second columns separated by the predetermined distance are provided at an upper region of the seat 2, while the seat-side lock penetrating holes 11c and 11d in the third and fourth columns separated by the predetermined distance are provided at a lower region of the seat 2. The seat-side lock penetrating holes 11b and 11c in the second and third columns according to this embodiment are not provided at the left region of the seat 2, and at the left region of the seat 2, the seat-side lock penetrating holes 11a and 11d in the first and fourth columns are provided along the longitudinal direction x1 only near the long side of the seat 2.

In this case, in the plurality of seat-side lock penetrating holes 11a in the first column, each long hole extends along the longitudinal direction x1 and arranged in a row with predetermined intervals along the longitudinal direction x1. In the plurality of seat-side lock penetrating holes 11b in the second column, each long hole extends along the longitudinal direction x1. The plurality of seat-side lock penetrating holes 11b in the second column are arranged in a row with predetermined intervals along the longitudinal direction x1 at a position separated by the predetermined distance from the seat-side lock penetrating holes 11a in the first column running in parallel with the seat-side lock penetrating holes 11a in the first column.

The distance between the seat-side lock penetrating holes 11a in the first column and the seat-side lock penetrating holes 11b in the second column is equal to the interval between the pair of side wall plates 14 and 15 of the electronic circuit holding units 3a and 3b (FIG. 1).

Further, in the plurality of seat-side lock penetrating holes 11c in the third column, each long hole extends along the longitudinal direction x1. The plurality of seat-side lock penetrating holes 11c in the third column are arranged in line with predetermined intervals along the longitudinal direction x1 at a position adjacent to the seat-side lock penetrating holes 11b in the second column running in parallel with the seat-side lock penetrating holes 11a and 11b in the first and second columns.

In the plurality of seat-side lock penetrating holes 11d in the fourth column, each long hole extends along the longitudinal direction x1. The plurality of seat-side lock penetrating holes 11d in the fourth column are arranged in line with predetermined intervals along the longitudinal direction x1 at a position separated by the predetermined distance from the seat-side lock penetrating holes 11c in the third column running in parallel with the seat-side lock penetrating holes 11c in the third column.

The distance between the seat-side lock penetrating holes 11c in the third column and the seat-side lock penetrating holes 11d in the fourth column is also equal to the interval between the pair of side wall plates 14 and 15 of the electronic circuit holding units 3a and 3b (FIG. 1).

The interval between the seat-side lock penetrating holes 11a in the first column is equal to the interval between wall-side lock protrusions 24a and 24b (24c and 24d) of the side wall plate 14 (15). In the same manner, the interval between the seat-side lock penetrating holes 11b in the second column, the interval between the seat-side lock penetrating holes 11c in the third column and the interval between the seat-side lock penetrating holes 11d in the fourth column are equal to the interval between the wall-side lock protrusions 24a and 24b (24c and 24d) of the side wall plate 14 (15).

Figure 3:
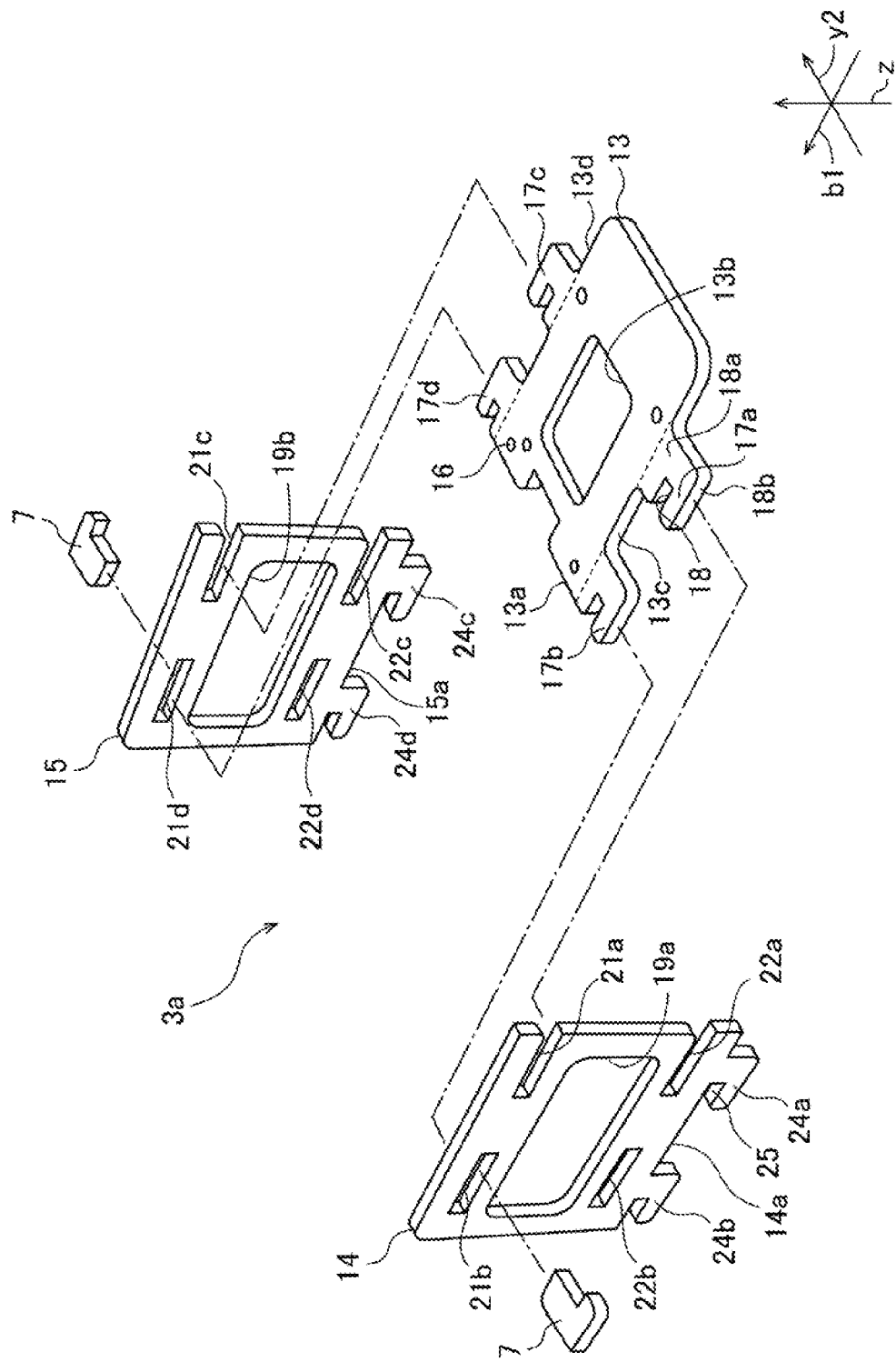
FIG. 3 is an exploded perspective view illustrating an electronic circuit holding unit in which a fixing plate is arranged at an upper row.

(3) Configuration of Electronic Circuit Holding Unit (3-1) Electronic Circuit Holding Unit in which the Fixing Plate is Arranged at the Upper Row Next, a configuration of the electronic circuit holding units 3a and 3b which can be removably installed to the seat 2 will be explained below. FIG. 3 is an exploded perspective view of the electronic circuit holding unit 3a in which the fixing plate 13 is arranged at the upper row. In FIG. 3, reference numeral z denotes a height direction, and reference numeral y2 denotes a direction in which the pair of side wall plates 14 and 15 faces. Reference numeral b1 denotes a direction orthogonal to the height direction z as well as the facing direction y2 to move the fixing plate 13 to be engaged with the pair of side wall plates 14 and 15.

As shown in FIG. 3, the electronic circuit holding unit 3a includes the fixing plate 13, the pair of side wall plates 14 and 15 and the fixing member 7. The electronic circuit holding unit 3a is assembled by a user using the fixing plate 13, the pair of side wall plates 14 and 15 and the fixing member 7.

The fixing plate 13 is made from a woody plate-shaped member having a predetermined thickness, and has a configuration that the electronic circuit 6a (FIG. 1) can be fixed to a planar surface. The fixing plate 13 has a main body 13a which is of rectangular shape corresponding to a rectangular outer shape of the commercially available electronic circuit 6a to be fixed, and the size of the main body 13a is selected such that the electronic circuit 6a does not protrude from a periphery of the main body 13a when the electronic circuit 6a is fixed on a surface.

In the main body 13a, a fixing hole 16 as a fixing portion is provided on a surface, and the electronic circuit 6a can be fixed to the surface by penetration of a bolt through the electronic circuit 6a, a cylindrical member and the fixing hole 16 and fastening by a nut, for example. The electronic circuit 6a can be fixed at a position with a predetermined height from the main body 13a by interposing the not shown cylindrical member. Also, in the main body 13a, a window portion 13b penetrating through the thickness is provided at a center portion of a region to which the electronic circuit 6a is fixed. With this configuration, in the fixing plate 13, a surface of the electronic circuit 6a can be exposed to the outside from the window portion 13b when the electronic circuit 6a is fixed, whereby heat of the electronic circuit 6a can be dissipated from the window portion 13b.

In the fixing plate 13, lock protrusions 17a and 17b are provided at one side 13c extending in a longitudinal direction of the main body 13a, and also lock protrusions 17c and 17d are provided at the other side 13d facing the side 13c and extending in the longitudinal direction of the main body 13a.

All the lock protrusions 17a, 17b, 17c and 17d have the same C-shape. For example, in the lock protrusion 17a, one end 18a of C-shape is integrally provided along the side 13c of the main body 13a, and the other end 18b of the C-shape is provided at a lateral outer position from the side 13c running in parallel with one end 18a.

A notch 18 is provided between one end 18a and the other end 18b of the lock protrusion 17a. The notch 18 provided at the lock protrusions 17a, 17b, 17c and 17d is cut out in the same direction, and the width of the notch 18 is substantially equal to a plate thickness of the side wall plates 14 and 15.

The fixing plate 13 is interposed between the pair of side wall plates 14 and 15, and the lock protrusions 17a, 17b, 17c and 17d are respectively engaged with lock penetrating holes 21a, 21b, 21c and 21d of the side wall plates 14 and 15, which will be described later, to hold the fixing plate 13 at a predetermined height.

Next, the side wall plates 14 and 15 will be explained. Since the side wall plates 14 and 15 according to this embodiment have the same configuration, here, an explanation will be made below mainly focusing on the side wall plate 14.

The side wall plate 14 is made from a woody plate-shaped member having a predetermined thickness in the same manner as the fixing plate 13. In the side wall plate 14, a plurality of lock penetrating holes 21a, 21b, 22a and 22b penetrating through the thickness are provided. In this case, the lock penetrating holes 21a and 21b are provided at the upper row of the side wall plate 14, and the lock penetrating holes 22a and 22b are provided lower than positions of the lock penetrating holes 21a and 21b in the side wall plate 14.

The lock penetrating holes 21a and 21b are an elongated hole into which the lock protrusions 17a and 17b of the fixing plate 13 can be inserted, and are linearly arranged in a row providing a predetermined distance. The distance between the lock penetrating holes 21a and 21b is equal to the distance between the lock protrusions 17a and 17b of the fixing plate 13. To the lock penetrating holes 21a and 21b of the side wall plate 14, the lock protrusions 17a and 17b of the fixing plate 13 are inserted. Thereafter, when the fixing plate 13 is moved in a direction of an arrow b1 in FIG. 3, plate portions at a periphery of the lock penetrating holes 21a and 21b of the side wall plate 14 are respectively interposed in the notches 18 of the lock protrusions 17a and 17b.

In the same manner, to the lock penetrating holes 21c and 21d of the other side wall plate 15, the other lock protrusions 17c and 17d of the fixing plate 13 are inserted, and when the fixing plate 13 is moved in a direction of the arrow b1 of FIG. 3, plate portions at a periphery of the lock penetrating holes 21c and 21d of the side wall plate 14 are respectively interposed in the notches 18 of the lock protrusions 17c and 17d.

With this configuration, the fixing plate 13 is interposed between the pair of opposed side wall plates 14 and 15, and the corresponding lock protrusions 17a, 17b, 17c and 17d of the fixing plate 13 can be engaged with the lock penetrating holes 21a, 21b, 21c and 21d of the side wall plates 14 and 15. In this way, the electronic circuit holding unit 3a in which the fixing plate 13 is held at the predetermined height (upper row) by the pair of side wall plates 14 and 15 can be assembled.

In this embodiment, after the lock protrusions 17a, 17b, 17c and 17d of the fixing plate 13 are engaged with the lock penetrating holes 21a, 21b, 21c and 21d of the side wall plates 14 and 15, the fixing members 7 are removably fitted into the lock penetrating hole 21b of the side wall plate 14 and the lock penetrating hole 21d of the side wall plate 15.

Accordingly, the lock protrusions 17b and 17d of the fixing plate 13 do not freely move in the lock penetrating holes 21b and 21d of the side wall plates 14 and 15 by the fixing member 7, which prevents removal of the lock protrusions 17a, 17b, 17c and 17d of the fixing plate 13 from each of the lock penetrating holes 21a, 21b, 21c and 21d of the side wall plates 14 and 15.

In the side wall plate 14, a window portion 19a penetrating through the thickness is provided between the upper lock penetrating holes 21a and 21b and the lower lock penetrating holes 22a and 22b. A window portion 19b is provided in the side wall plate 15 in the same manner.

In addition to such configuration, on a lower side of the side wall plate 14 (15), the wall-side lock protrusions 24a and 24b (24c and 24d) are provided on one side 14a (15a) to be engaged with the seat-side lock penetrating holes 10a, 10b, 10c, 10d, 11a, 11b, 11c and 11d of the seat 2. Here, the wall-side lock protrusions 24a and 24b of the side wall plate 14 have the same L-shape. In the wall-side lock protrusions 24a and 24b, one tip portion of L-shape is integrated with one side 14a of the side wall plate 14, and a notch 25 is provided between each of the wall-side lock protrusions 24a and 24b and the one side 14a of the side wall plate 14.

The width of the notch 25 is substantially equal to a plate thickness of the seat 2. In the side wall plate 14, for example, when the wall-side lock protrusions 24a and 24b are inserted into the seat-side lock penetrating holes 10a and the side wall plate 14 is moved in a direction of the arrow b1 in FIG. 3, plate portions at a periphery of the seat-side lock penetrating holes 10a of the seat 2 are respectively interposed in the notches 25 of the wall-side lock protrusions 24a and 24b.

In this way, using the electronic circuit holding unit 3a, among the seat-side lock penetrating holes (10a, 10b), (10c, 10d), (11a, 11b) and (11c, 11d) of the seat 2, the seat-side lock penetrating holes 10a and 10b into which the wall-side lock protrusions 24a, 24b, 24c and 24d of the pair of opposed side wall plates 14 and 15 can be inserted are selected, for example, and the wall-side lock protrusions 24a, 24b, 24c and 24d are engaged with the seat-side lock penetrating holes 10a and 10b. As a result, the electronic circuit holding unit 3a can be fixed at a predetermined position of the seat 2.

Figure 4:
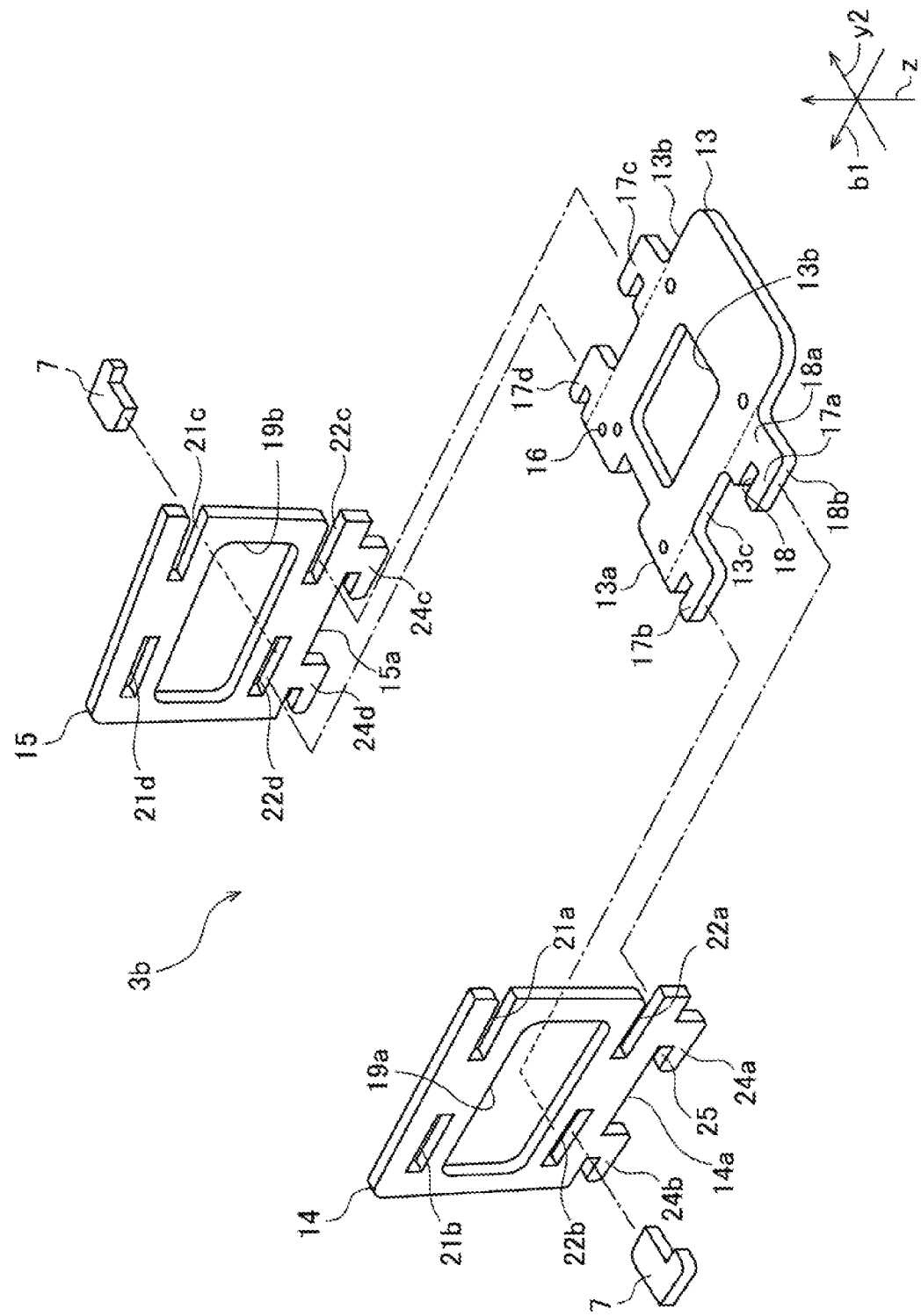
FIG. 4 is an exploded perspective view illustrating the electronic circuit holding unit in which the fixing plate is arranged at a lower row.

(3-2) Electronic Circuit Holding Unit in which the Fixing Plate is Arranged at the Lower Row FIG. 4 is an exploded perspective view of the electronic circuit holding unit 3b in which the fixing plate 13 is arranged at the lower row. In this case, the lock protrusions 17a, 17b, 17c and 17d of the fixing plate 13 are respectively engaged with the lock penetrating holes 22a, 22b, 22c and 22d provided lower than the positions of the lock penetrating holes 21a, 21b, 21c and 21d of the side wall plates 14 and 15, and are held at a lower position than the window portions 19a and 19b.

The lock penetrating holes 22a and 22b are an elongated hole into which the lock protrusions 17a and 17b of the fixing plate 13 can be inserted, and are linearly arranged in a row providing a predetermined distance. The distance between the lock penetrating holes 22a and 22b is equal to the distance between the lock protrusions 17a and 17b of the fixing plate 13. To the lock penetrating holes 22a and 22b of the side wall plate 14, the lock protrusions 17a and 17b of the fixing plate 13 are inserted. Thereafter, when the fixing plate 13 is moved in a direction of an arrow b1 in FIG. 4, plate portions at a periphery of the lock penetrating holes 22a and 22b of the side wall plate 14 are respectively interposed in the notches 18 of the lock protrusions 17a and 17b.

In the same manner, to the lock penetrating holes 22c and 22d of the other side wall plate 15, the other lock protrusions 17c and 17d of the fixing plate 13 are inserted, and when the fixing plate 13 is moved in a direction of the arrow b1 of FIG. 4, plate portions at a periphery of the lock penetrating holes 22c and 22d of the side wall plate 15 are respectively interposed in the notches 18 of the lock protrusions 17c and 17d.

With this configuration, the fixing plate 13 is interposed between the pair of opposed side wall plates 14 and 15, and the corresponding lock protrusions 17a, 17b, 17c and 17d of the fixing plate 13 are engaged with the lock penetrating holes 22a, 22b, 22c and 22d of the side wall plates 14 and 15. In this way, the electronic circuit holding unit 3b in which the fixing plate 13 is held at a predetermined height (lower row) by the pair of side wall plates 14 and 15 can be assembled.

In this embodiment, after the lock protrusions 17a, 17b, 17c and 17d of the fixing plate 13 are engaged with the lock penetrating holes 22a, 22b, 22c and 22d of the side wall plates 14 and 15, the fixing members 7 are removably fitted into the lock penetrating hole 22b of the side wall plate 14 and the lock penetrating hole 22d of the side wall plate 15.

Accordingly, the lock protrusions 17b and 17d of the fixing plate 13 do not freely move in the lock penetrating holes 22b and 22d of the side wall plates 14 and 15 by the fixing member 7, which prevents removal of the lock protrusions 17a, 17b, 17c and 17d of the fixing plate 13 from each of the lock penetrating holes 22a, 22b, 22c and 22d of the side wall plates 14 and 15.

Using the electronic circuit holding unit 3b thus assembled, among the seat-side lock penetrating holes (10a, 10b), (10c, 10d), (11a, 11b) and (11c, 11d) of the seat 2, the seat-side lock penetrating holes 10a, 10b into which the wall-side lock protrusions 24a, 24b, 24c and 24d of the pair of opposed side wall plates 14 and 15 can be inserted are selected, for example, and the wall-side lock protrusions 24a, 24b, 24c and 24d are engaged with the seat-side lock penetrating holes 10a and 10b. As a result, the electronic circuit holding unit 3b can be fixed at a predetermined position of the seat 2.

(4) Usage Patterns of Electronic Circuit Holder (4-1) First Usage Example

Figure 5:
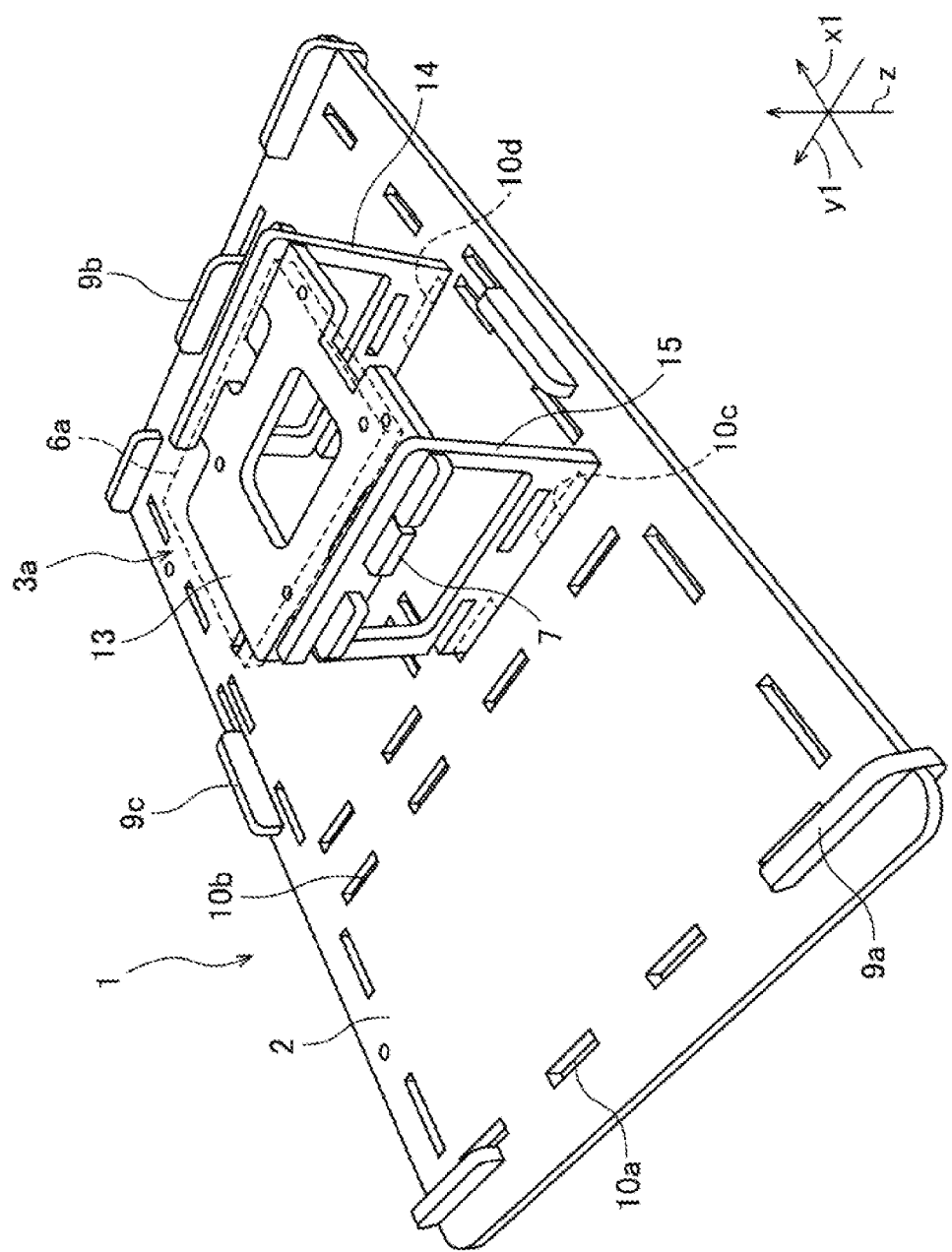
FIG. 5 is a schematic view illustrating a configuration that the electronic circuit holding unit is installed on the seat to be directed in a predetermined direction.

Next, usage patterns of the electronic circuit holder 1 will be sequentially explained. FIG. 5 shows one example when the electronic circuit holding unit 3a in which the fixing plate 13 is held at the upper row by the pair of side wall plates 14 and 15 is provided at the center region of the seat 2.

In this case, the wall-side lock protrusions 24c and 24d (FIG. 3) of the side wall plate 15 are engaged with the seat-side lock penetrating holes 10c in the third row arranged along the short direction y1 of the seat 2, and the wall-side lock protrusions 24a and 24b (FIG. 3) of the side wall plate 14 are engaged with the seat-side lock penetrating holes 10d in the fourth row separated by a predetermined distance from the seat-side lock penetrating holes 10c in the third row.

The interval between the seat-side lock penetrating holes 10c in the third row and the interval between the seat-side lock penetrating holes 10d in the fourth row correspond to the interval between the wall-side lock protrusions 24a and 24b (24c and 24d) of the side wall plate 14 (15). Consequently, by changing positions of the seat-side lock penetrating hole 10c in the third row and the seat-side lock penetrating hole 10d in the fourth row for engagement with the wall-side lock protrusions 24a, 24b, 24c and 24d of the side wall plates 14 and 15 along the short direction y1 of the seat 2, the electronic circuit holding unit 3a can be fixed at a desired position at the center region of the seat 2. The electronic circuit holding unit 3a can change a position to be fixed to the seat 2 in each case when it is required in accordance with a fixing position of the breadboard 5 on the seat 2.

In this embodiment, by fixing the pair of side wall plates 14 and 15 to the seat-side lock penetrating holes 10c and 10d running in parallel with the short direction y1 of the seat 2, a longitudinal direction of the fixing plate 13 interposed between the opposed side wall plates 14 and 15 can be directed to the short direction y1 of the seat 2.

(4-2) Second Usage Example

Figure 6:
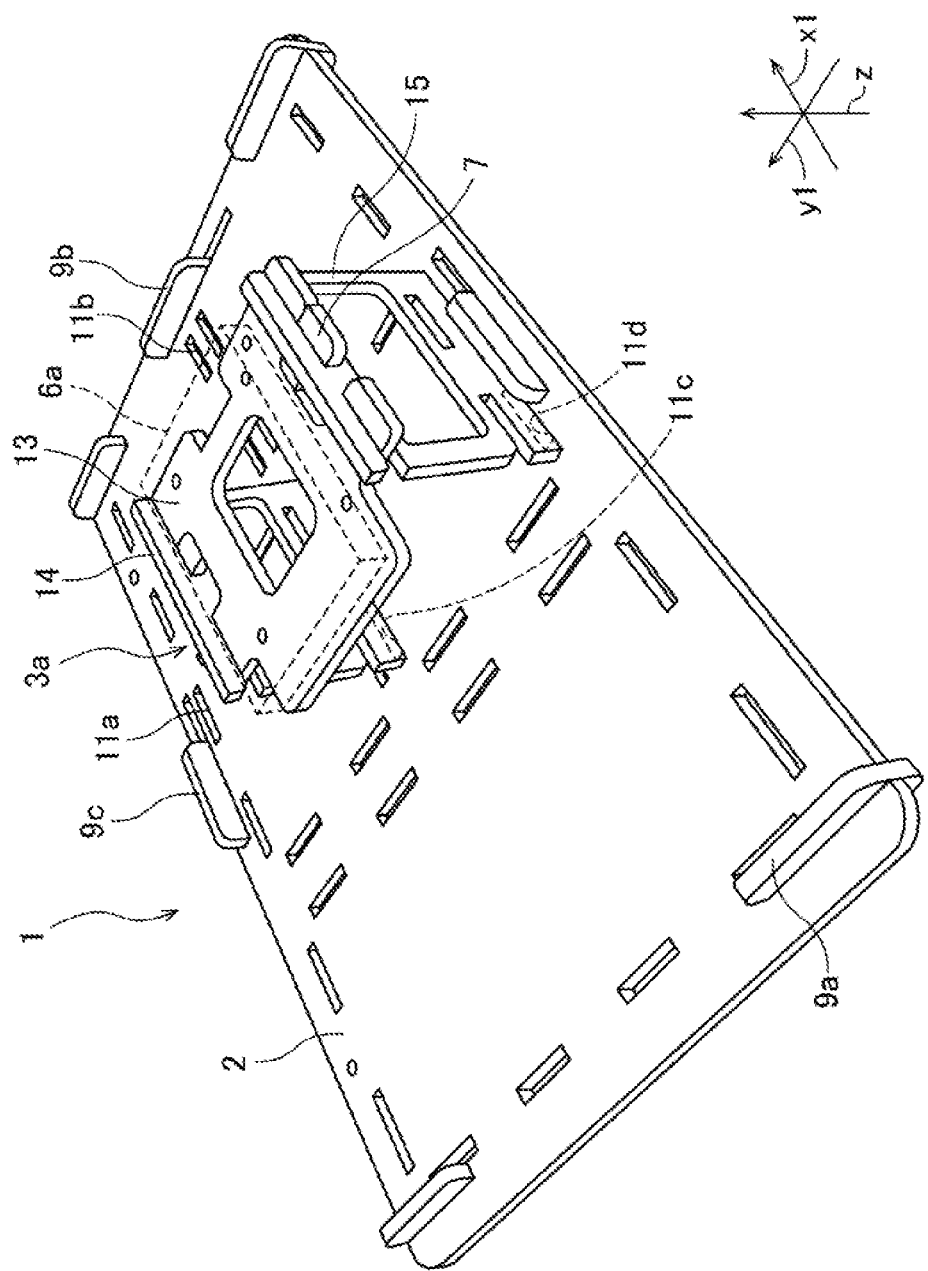
FIG. 6 is a schematic view illustrating a configuration that the electronic circuit holding unit is installed on the seat to be directed in another direction.

FIG. 6 shows one example when a direction of the electronic circuit holding unit 3a in which the fixing plate 13 is held at the upper row by the pair of side wall plates 14 and 15 is changed at the center region of the seat 2.

In this case, in the seat 2, the wall-side lock protrusions 24a and 24b of the side wall plate 14 (FIG. 3) are engaged with the seat-side lock penetrating hole 11c in the third column arranged along the longitudinal direction x1, and the wall-side lock protrusions 24c and 24d of the side wall plate 15 (FIG. 3) are engaged with the seat-side lock penetrating hole 11d in the fourth column separated by a predetermined distance from the seat-side lock penetrating hole 11c in the third column.

The interval between the seat-side lock penetrating holes 11c in the third column and the interval between the seat-side lock penetrating holes 11d in the fourth column correspond to the interval between the wall-side lock protrusions 24a and 24b (24c and 24d) of the side wall plate 14 (15). Consequently, by changing positions of the seat-side lock penetrating hole 11c in the third column and the seat-side lock penetrating hole 11d in the fourth column for engagement with the wall-side lock protrusions 24a, 24b, 24c and 24d of the side wall plates 14 and 15 along the longitudinal direction x1 of the seat 2, the electronic circuit holding unit 3a can be fixed at a desired position in the seat 2.

In this embodiment, by fixing the pair of side wall plates 14 and 15 to the seat-side lock penetrating holes 11c and 11d running in parallel with the longitudinal direction x1 of the seat 2, a longitudinal direction of the fixing plate 13 interposed between the opposed side wall plates 14 and 15 can be directed to the longitudinal direction x1 of the seat 2. With this configuration, the electronic circuit 6a fixed on a surface of the fixing plate 13 can be turned by 90° from the state of FIG. 5 to change its direction. Thus, the electronic circuit holding unit 3a can change a direction of the electronic circuit 6a to the seat 2 for fixing in each case when it is required considering the fixing position of the breadboard 5 on the seat 2 and a circuit configuration in the electronic circuit 6a.

(4-3) Third Usage Example

Figure 7:
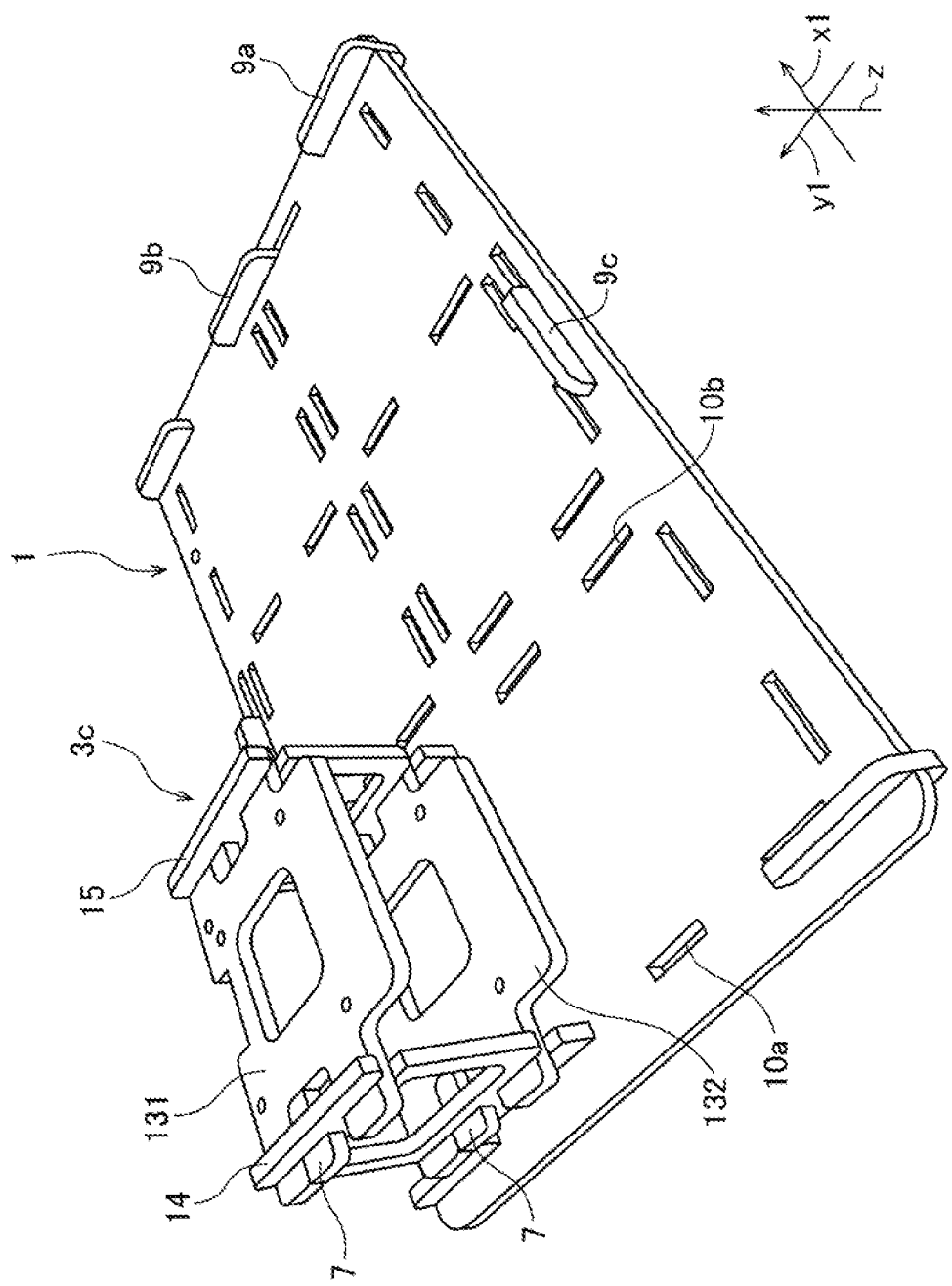
FIG. 7 is a schematic view illustrating the electronic circuit holding unit in which fixing plates are arranged at both the upper row and the lower row.

FIG. 7 shows an electronic circuit holding unit 3c in which the pair of side wall plates 14 and 15 hold fixing plates 131 and 132 at both the upper row and the lower row, respectively. In this case, the fixing plate 131 at the upper row is interposed between the pair of opposed side wall plates 14 and 15, and the corresponding lock protrusions 17a, 17b, 17c and 17d of the fixing plate 131 are respectively engaged with the lock penetrating holes 21a, 21b, 21c and 21d of the side wall plates 14 and 15.

The fixing plate 132 at the lower row is interposed between the pair of opposed side wall plates 14 and 15, and the corresponding lock protrusions 17a, 17b, 17c and 17d of the fixing plate 132 are respectively engaged with the lock penetrating holes 22a, 22b, 22c and 22d of the side wall plates 14 and 15. In this way, the electronic circuit holding unit 3c in which two fixing plates 131 and 132 are simultaneously held by the pair of side wall plates 14 and 15 can be assembled.

Using such electronic circuit holding unit 3c, among the seat-side lock penetrating holes (10a, 10b), (10c, 10d), (11a, 11b) and (11c, 11d) of the seat 2, the seat-side lock penetrating holes 10a and 10b into which the wall-side lock protrusions 24a, 24b, 24c and 24d of the pair of opposed side wall plates 14 and 15 can be inserted are selected, for example, and the wall-side lock protrusions 24a, 24b, 24c and 24d are engaged with the seat-side lock penetrating holes 10a and 10b. As a result, the electronic circuit holding unit 3c can be fixed at a predetermined position of the seat 2.

Figure 8:
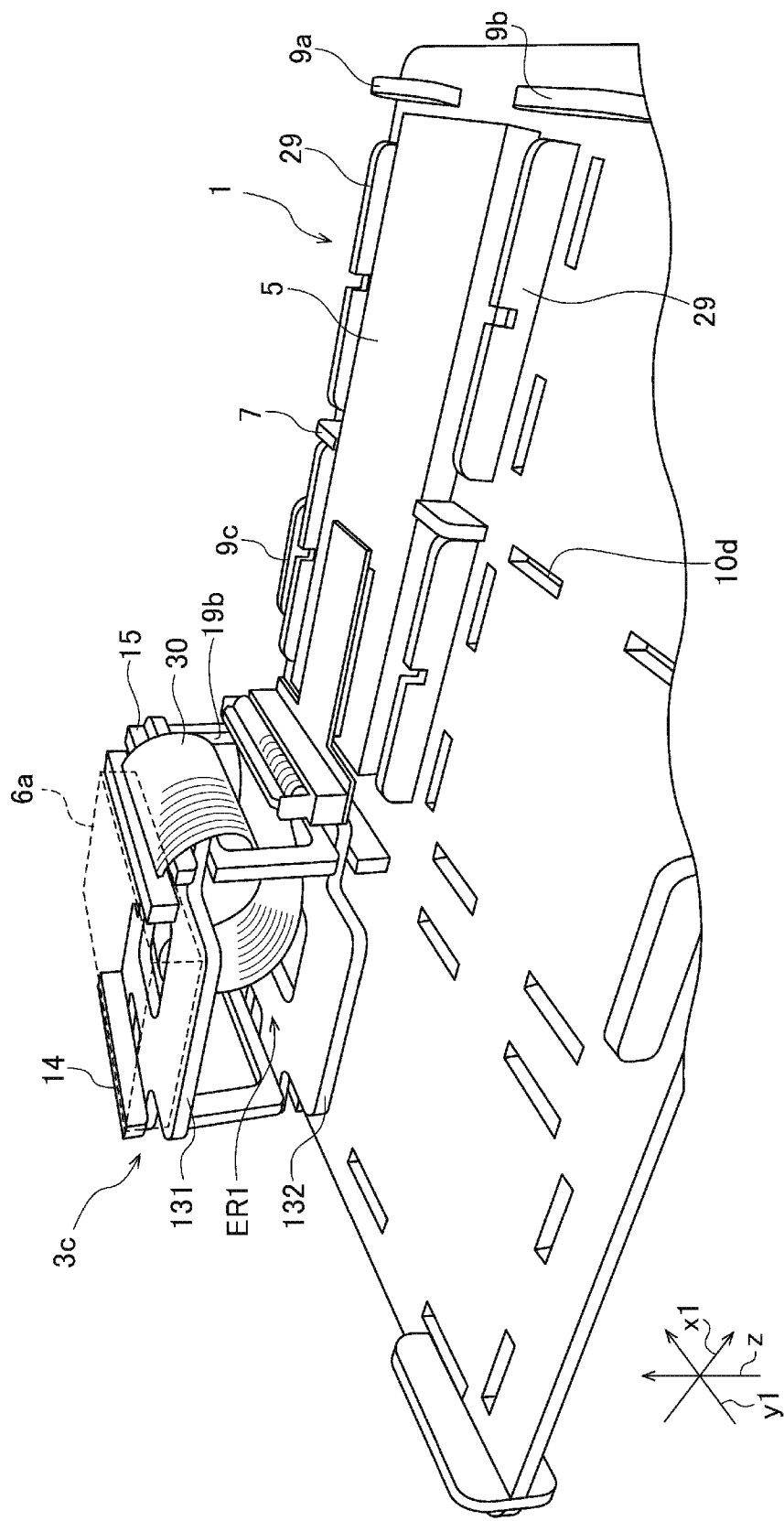
FIG. 8 is a schematic view illustrating a configuration that a bendable flat cable is housed in the electronic circuit holding unit.

FIG. 8 is a schematic view illustrating a usage example of the electronic circuit holding unit 3c in which the pair of side wall plates 14 and 15 hold two fixing plates 131 and 132. In the electronic circuit holder 1 shown in FIG. 8, the electronic circuit holding unit 3c and the breadboard 5 are arranged in series along the longitudinal direction x1 of the seat 2. In the breadboard 5, a longitudinal direction is arranged along the longitudinal direction x1 of the seat 2, and by the fixing member 7 fitted into the seat-side lock penetrating hole 10d of the seat 2, both side surfaces of the breadboard 5 are pressed to be fixed.

In this embodiment, a plate-shaped protrusion 29 is fitted into the seat-side lock penetrating holes 11a and 11b to surround a region for fixing the breadboard 5.

In the electronic circuit holding unit 3c, no electronic circuit 6a is fixed on a surface of the fixing plate 132 at the lower row, while the electronic circuit 6a is fixed on a surface of the fixing plate 131 at the upper row, and a belt-shaped flat cable 30 connected to the breadboard 5 is connected to the corresponding electronic circuit 6a. In the electronic circuit holder 1, a position of the electronic circuit holding unit 3c on the seat 2 can be freely changed in accordance with a fixing position of the breadboard 5, so that the electronic circuit 6a can be serially arranged to the breadboard 5. Consequently, the flat cable 30 extending from the breadboard 5 can be connected to the electronic circuit 6a without forcedly twisting the flat cable 30.

Between the pair of side wall plates 14 and 15, a space ER1 is provided below the fixing plate 131 at the upper row. Here, the side wall plate 15 arranged at a position facing the breadboard 5 has a window portion 19b between the fixing plate 131 at the upper row and the fixing plate 132 at the lower row, whereby the flat cable 30 extending from the breadboard 5 can be introduced into the space ER1 via the window portion 19b. Consequently, using the electronic circuit holding unit 3c, the flat cable 30 connecting the electronic circuit 6a fixed on the fixing plate 131 at the upper row to the breadboard 5 fixed on the surface of the seat 2 can be bent in a U-shape and housed in the space ER1.

(4-4) Fourth Usage Example

Figure 9:
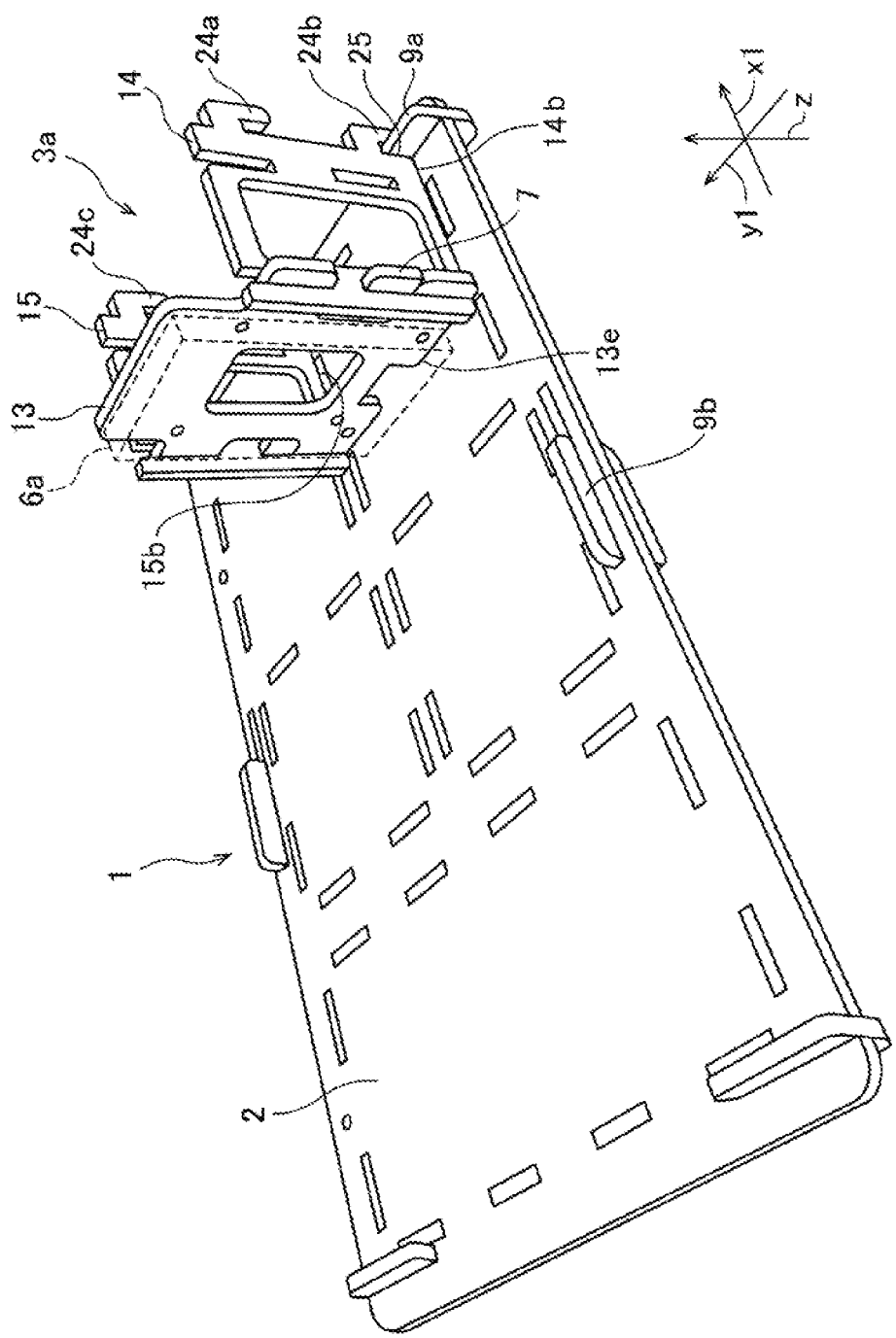
FIG. 9 is a schematic view illustrating a usage example of the electronic circuit holding unit when the electronic circuit fixed to the fixing plate is vertically arranged to a surface of the seat.

FIG. 9 is a schematic view illustrating a usage example of the electronic circuit holding unit 3a when the electronic circuit 6a fixed to the fixing plate 13 is vertically arranged to the surface of the seat 2. Here, the pair of side wall plates 14 and 15 has the wall-side lock protrusions 24b and 24d, respectively, which can be engaged not only with the seat-side lock penetrating holes 10a, 10b, 10c, 10d, 11a, 11b, 11c and 11d of the seat 2, but also with the plate-shaped protrusions 9a and 9c of the seat 2.

More specifically, the width of the notches 25 of the wall-side lock protrusions 24b and 24d is substantially equal to a plate thickness of the plate-shaped protrusions 9*a* and 9*c*. The notches 25 of the pair of side wall plates 14 and 15 are fitted into the plate-shaped protrusions 9*a* and 9*c*, thus the wall-side lock protrusions 24*b* and 24*d* can be engaged with the plate-shaped protrusions 9*a* and 9*c*.

When the notches 25 of the wall-side lock protrusions 24*b* and 24*d* are engaged with the plate-shaped protrusions 9*a* and 9*c*, sides 14*b* and 15*b* of the side wall plates 14 and 15 abut on the surface of the seat 2. Here, the sides 14*b* and 15*b* of the side wall plates 14 and 15 abutting on the surface of the seat 2 extend perpendicularly to a surface of the fixing plate 13.

Using the electronic circuit holding unit 3*a*, when the notches 25 of the wall-side lock protrusions 24*b* and 24*d* are engaged with the plate-shaped protrusions 9*a* and 9*c*, and the sides 14*b* and 15*b* of the side wall plates 14 and 15 abut on the surface of the seat 2, the surface of the fixing plate 13 is held vertically to the surface of the seat 2. Consequently, the electronic circuit 6*a* fixed on the surface of the fixing plate 13 can be held vertically to the seat 2.

In this embodiment, when the notches 25 of the wall-side lock protrusions 24*b* and 24*d* are engaged with the plate-shaped protrusions 9*a* and 9*c*, a side 13*e* of the fixing plate 13 also abuts on the surface of the seat 2. That is, all of the sides 14*b* and 15*b* of the side wall plates 14 and 15 and the side 13*e* of the fixing plate 13 are provided on the same plane. Thus, when the notches 25 of the wall-side lock protrusions 24*b* and 24*d* are engaged with the plate-shaped protrusions 9*a* and 9*c*, all of the sides 14*b* and 15*b* of the side wall plates 14 and 15 and the side 13*e* of the fixing plate 13 abut on the surface of the seat 2, whereby the surface of the fixing plate 13 can be stably held vertically to the surface of the seat 2.

(4-5) Fifth Usage Example

In FIG. 9 described above, a case where the entire electronic circuit holding unit 3*a* is arranged on the seat 2 and the electronic circuit 6*a* fixed on the fixing plate 13 is provided on the seat 2 has been explained. However, as shown in FIG. 10, in the electronic circuit holding unit 3*a*, the electronic circuit 6*a* fixed on the fixing plate 13 can be provided at a lateral outer position separated from the seat 2.

For example, in a case where various parts including a plurality of breadboards 5 and other electronic circuits and batteries need to be provided on the surface of the seat 2, the seat 2 has no region for arranging the electronic circuit holding unit 3*a*, so that there may be a situation that the electronic circuit holding unit 3*a* is difficult to be provided on the seat 2.

Figure 10:
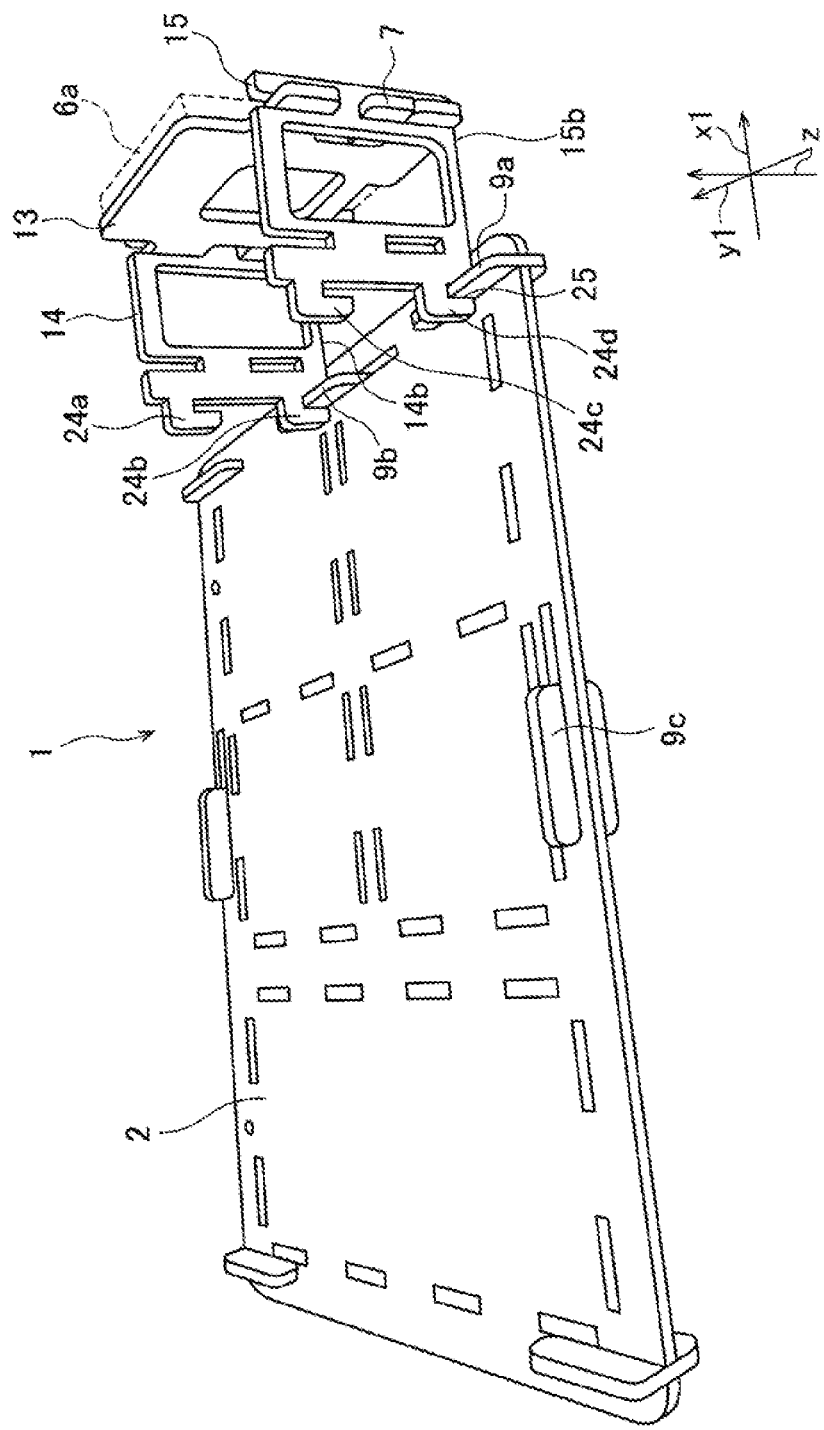
FIG. 10 is a schematic view illustrating a usage example of the electronic circuit holding unit when the electronic circuit fixed to the fixing plate is arranged at a separate position from the seat.

In such a case, as shown in FIG. 10, while the fixing plate 13 of the electronic circuit holding unit 3*a* is arranged on the lateral outer position separated from the seat 2, the notches 25 of the wall-side lock protrusions 24*b* and 24*d* are fitted into the plate-shaped protrusions 9*a* and 9*b*, thereby allowing the pair of side wall plates 14 and 15 to be engaged with the plate-shaped protrusions 9*a* and 9*b*. When the notches 25 of the wall-side lock protrusions 24*b* and 24*d* are engaged with the plate-shaped protrusions 9*a* and 9*b*, the sides 14*b* and 15*b* of the side wall plates 14 and 15 partially abut only on a surface adjacent to an outer periphery of the seat 2, so that the electronic circuit holding unit 3*a* can be fixed to the seat 2.

In this way, using the electronic circuit holding unit 3*a*, even when the fixing plate 13 is arranged at the lateral outer position of the seat 2, the notches 25 of the wall-side lock protrusions 24*b* and 24*d* are engaged with the plate-shaped protrusions 9*a* and 9*b*, and the sides 14*b* and 15*b* of the side wall plates 14 and 15 partially abut on the surface of the seat 2, so that the surface of the fixing plate 13 can be held vertically to the surface of the seat 2.

In this way, the electronic circuit 6*a* fixed on the surface of the fixing plate 13 can be held vertically to the seat 2, not being arranged on the seat 2, at the lateral outer position of the seat 2.

(4-6) Sixth Usage Example

Figure 11:
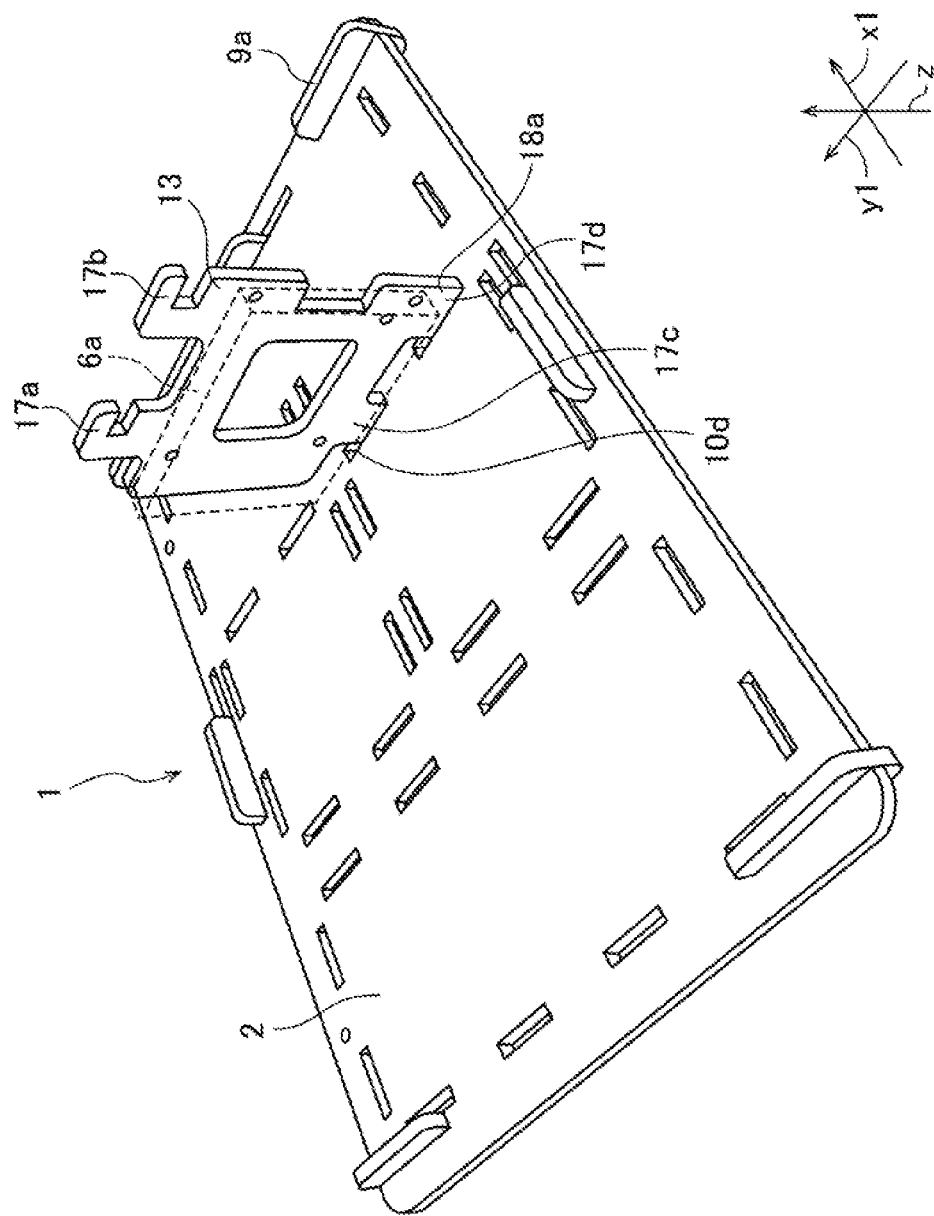
FIG. 11 is a schematic view illustrating a usage example in which the electronic circuit is vertically held to the seat using only the fixing plate.

FIG. 11 is a schematic view illustrating a usage example in which the electronic circuit 6*a* is vertically held to the seat 2 using only the fixing plate 13. Here, the lock protrusions 17*a*, 17*b*, 17*c* and 17*d* of the fixing plate 13 can be engaged with the seat-side lock penetrating holes 10*a*, 10*b*, 10*c*, 10*d*, 11*a*, 11*b*, 11*c* and 11*d* of the seat 2.

More specifically, the width of notches 18 of the lock protrusions 17*a*, 17*b*, 17*c* and 17*d* (FIG. 3) is substantially equal to the plate thickness of the seat 2. In the fixing plate 13, to any of the seat-side lock penetrating holes 10*a*, 10*b*, 10*c*, 10*d*, 11*a*, 11*b*, 11*c* and 11*d* of the seat 2, the lock protrusions 17*c* and 17*d* are inserted, for example, and the seat 2 is interposed in the notches 18 of the lock protrusions 17*c* and 17*d*. As a result, the fixing plate 13 allows the lock protrusions 17*c* and 17*d* to be engaged with the seat-side lock penetrating holes 10*d*.

When the lock protrusions 17*c* and 17*d* of the fixing plate 13 are engaged with the seat-side lock penetrating holes 10*d*, the surface of the fixing plate 13 is held vertically to the surface of the seat 2. Thus, the electronic circuit 6*a* fixed to the surface of the fixing plate 13 can be held vertically to the seat 2.

(5) Operation and Effect

In the above configuration, the electronic circuit holder 1 includes the fixing plate 13 having the fixing hole 16 for fixing the electronic circuits 6*a* and 6*b* on the surface of the fixing plate 13, and having the lock protrusions 17*a*, 17*b*, 17*c* and 17*d* on the opposed sides 13*c* and 13*d*. Also, the electronic circuit holder 1 includes the pair of side wall plates 14 and 15 between which the fixing plate 13 is interposed such that the lock protrusions 17*a*, 17*b*, 17*c* and 17*d* are engaged with the lock penetrating holes 21*a*, 21*b*, 21*c* and 21*d* (22*a*, 22*b*, 22*c* and 22*d*) to hold the fixing plate 13 at a predetermined height. On the sides 14*a* and 15*a* of the side wall plates 14 and 15, the wall-side lock protrusions 24*a*, 24*b*, 24*c* and 24*d* are provided to be engaged with the seat-side lock penetrating holes 10*a*, 10*b*, 10*c*, 10*d*, 11*a*, 11*b*, 11*c* and 11*d* provided in the seat 2.

The electronic circuit holder 1 allows a user to select one of the pairs of seat-side lock penetrating holes (10*a*, 10*b*), (10*c*, 10*d*), (11*a*, 11*b*) and (11*c*, 11*d*) to be engaged with the wall-side lock protrusions 24*a*, 24*b*, 24*c* and 24*d* of the pair of side wall plates 14 and 15 among the plurality of seat-side lock penetrating holes 10*a*, 10*b*, 10*c*, 10*d*, 11*a*, 11*b*, 11*c* and 11*d* provided in the seat 2. This makes it possible to change the position of the fixing plate 13 on the seat 2 in accordance with a position of another part such as the breadboard 5 to be installed on the seat 2.

In this way, using the electronic circuit holder 1, the electronic circuits 6*a* and 6*b* as well as the breadboard 5 can be fixed to the desired position on the seat 2. Consequently, the wiring operation can be executed in a state that the electronic circuits 6*a* and 6*b* are stabled, and thus the simple wiring operation can be executed. Also, in the electronic circuit holder 1, the electronic circuits 6a and 6b can be moved to the desired position on the seat 2 to be fixed to the seat 2 in accordance with the wiring situation of the electronic circuits 6a and 6b on the seat 2, which can eliminate complication of the wiring routing from the electronic circuits 6a and 6b.

In the electronic circuit holder 1, by switching to one of the rows of the lock penetrating holes 21a, 21b, 21c and 21d (22a, 22b, 22c and 22d) with which the lock protrusions 17a, 17b, 17c and 17d of the fixing plate 13 are engaged in accordance with the electronic circuits 6a and 6b and the position of another part (e.g., the breadboard 5) to be installed on the seat 2, the position of the fixing plate 13 can be freely changed in the height direction z of the seat 2. Consequently, in the electronic circuit holder 1, in addition to movement of the fixing plate 13 on a flat surface of the seat 2, the fixing plate 13 can be moved also in the height direction z of the seat 2, thereby enhancing a degree of freedom of layout on the seat 2 of the electronic circuits 6a and 6b and the breadboard 5.

(6) Other Embodiments

In the above embodiments, the woody fixing plate 13 and side wall plates 14, 15, etc. are employed. However, the fixing plate 13 and the side wall plates 14, 15, etc. may be made from an acrylic plate, a glass plate or others.

In the above embodiment, each of the pair of side wall plates 14 and 15 has the lock penetrating holes arranged in two rows to provide the fixing plates 13 at the lower row (i.e., the first row) and the upper row (i.e., the second row). The embodiments of the present invention are not limited to this. For example, each of the pair of side wall plates may have only one row of lock penetrating holes. Alternatively, each of the pair of side wall plates may have the lock penetrating holes arranged in two or more rows, for example, in three rows or four rows.

If the lock penetrating holes are arranged in two or more rows in the side wall plates 14 and 15, the fixing plate 13 can be held at a height of the upper row (i.e., the second and subsequent rows) between the pair of side wall plates 14 and 15. In this case, as in the usage example shown in FIG. 8, when the fixing plate 13 is held at the height of the upper row between the pair of side wall plates 14 and 15, a space is provided below the fixing plate 13 between the pair of side wall plates 14 and 15 to accommodate the bendable flat cable 30.

In the above embodiment, the commercially available electronic circuits 6a and 6b including the single-board computer called as the Raspberry Pi® are employed. In some embodiments, however, various electronic circuits such as a light emitting circuit including a CCD camera, a memory, a display and an LED may also be employed. Also, instead of the breadboard 5 as another part, various other parts required for trail manufacture of electrical equipment such as a battery pack may be employed, in addition to the above electronic circuits.

Moreover, in the above embodiments, the fixing hole 16 is applied as a fixing portion. In some embodiments, however, the electronic circuits 6a and 6b may be fixed to the fixing plates 13 when a fixing portion which does not penetrate through the thickness of the fixing plate 13 is fastened by a screw.

In the above embodiments, the seat-side lock penetrating holes 10a, 10b, 10c and 10d sequentially arranged along the longitudinal direction x1 of the seat 2 and the seat-side lock penetrating holes 11a, 11b, 11c and 11d sequentially arranged along the short direction y1 of the seat 2 are provided as the plurality of seat-side lock penetration holes. In some embodiments, however, the plurality of seat-side lock penetrating holes may be arranged in a matrix.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic circuit holder comprising:
 a fixing plate having:
  a fixing portion for fixing an electronic circuit on a surface of the fixing plate; and
  lock protrusions on opposed sides of the fixing plate;
 a pair of side wall plates between which the fixing plate is configured to be interposed, a first of the pair of side wall plates having first lock penetrating holes, and a second of the pair of side wall plates having second lock penetrating holes, the lock protrusions of the fixing plate being configured to be engaged with the first and second lock penetrating holes to hold the fixing plate at a predetermined height; and
 a seat having a plurality of seat-side lock penetrating holes arranged at a predetermined interval,
 wherein: the first of the pair of side wall plates has, on a side thereof, a first wall-side lock protrusion, and the second of the pair of side wall plates has, on a side thereof, a second wall-side lock protrusion, the first and second wall-side lock protrusions being defined as a pair of wall-side lock protrusions configured to be engaged with a pair of seat-side lock penetrating holes of the plurality of seat-side lock penetrating holes;
 the seat allows a user to select the pair of seat-side lock penetrating holes from among the plurality of seat-side lock penetrating holes to engage the pair of wall-side lock protrusions with the pair of seat-side lock penetrating holes, thereby changing a position of the fixing plate on the seat in accordance with a position of another part to be installed on the seat;
 the first lock penetrating holes of the first of the pair of side wall plates and the second lock penetrating holes of the second of the pair of side wall plates are arranged in two or more rows; and
 the position of the fixing plate is configured to be changed in a height direction of the seat by switching to one of the two or more rows of the first and second lock penetrating holes with which the lock protrusions of the fixing plate are configured to be engaged, in accordance with the position of another part to be installed on the seat.

2. The electronic circuit holder according to claim 1, wherein
 a first row of the two or more rows of the first and second lock penetrating holes is defined as a lower row,
 second and subsequent rows of the two or more rows of the first and second lock penetrating holes are defined as an upper row, and
 when the fixing plate is held at a height of the upper row between the pair of side wall plates, a space is provided below the fixing plate between the pair of side wall plates to accommodate a bendable flat cable connecting another part on the seat to the electronic circuit on the fixing plate.

3. An electronic circuit holder comprising:
a fixing plate having:
   a fixing portion for fixing an electronic circuit on a surface of the fixing plate; and
   lock protrusions on opposed sides of the fixing plate;
a pair of side wall plates between which the fixing plate is configured to be interposed, a first of the pair of side wall plates having first lock penetrating holes, and a second of the pair of side wall plates having second lock penetrating holes, the lock protrusions of the fixing plate being configured to be engaged with the first and second lock penetrating holes to hold the fixing plate at a predetermined height; and
a seat having a plurality of seat-side lock penetrating holes arranged at a predetermined interval, and having plate-shaped protrusions,
wherein: the first of the pair of side wall plates has, on a side thereof, a first wall-side lock protrusion, and the second of the pair of side wall plates has, on a side thereof, a second wall-side lock protrusion, the first and second wall-side lock protrusions being defined as a pair of wall-side lock protrusions configured to be engaged with a pair of seat-side lock penetrating holes of the plurality of seat-side lock penetrating holes;
the seat allows a user to select the pair of seat-side lock penetrating holes from among the plurality of seat-side lock penetrating holes to engage the pair of wall-side lock protrusions with the pair of seat-side lock penetrating holes, thereby changing a position of the fixing plate on the seat in accordance with a position of another part to be installed on the seat;
each of the first wall-side lock protrusion and the second wall-side lock protrusion has a shape allowing engagement with each of the plate-shaped protrusions; and
when the first wall-side lock protrusion and the second wall-side lock protrusion are engaged with the plate-shaped protrusions instead of the pair of seat-side lock penetrating holes, the surface of the fixing plate is vertical to a surface of the seat.

4. An electronic circuit holder comprising:
a fixing plate having:
   a fixing portion for fixing an electronic circuit on a surface of the fixing plate; and
   lock protrusions on opposed sides of the fixing plate;
a pair of side wall plates between which the fixing plate is configured to be interposed, a first of the pair of side wall plates having first lock penetrating holes, and a second of the pair of side wall plates having second lock penetrating holes, the lock protrusions of the fixing plate being configured to be engaged with the first and second lock penetrating holes to hold the fixing plate at a predetermined height; and
a seat having a plurality of seat-side lock penetrating holes arranged at a predetermined interval,
wherein: the first of the pair of side wall plates has, on a side thereof, a first wall-side lock protrusion, and the second of the pair of side wall plates has, on a side thereof, a second wall-side lock protrusion, the first and second wall-side lock protrusions being defined as a pair of wall-side lock protrusions configured to be engaged with a pair of seat-side lock penetrating holes of the plurality of seat-side lock penetrating holes;
the seat allows a user to select the pair of seat-side lock penetrating holes from among the plurality of seat-side lock penetrating holes to engage the pair of wall-side lock protrusions with the pair of seat-side lock penetrating holes, thereby changing a position of the fixing plate on the seat in accordance with a position of another part to be installed on the seat; and
each of the lock protrusions of the fixing plate has a shape allowing engagement with each of the plurality of seat-side lock penetrating holes of the seat.

* * * * *